United States Patent [19]

Bhadriraju

[11] Patent Number: 4,754,425

[45] Date of Patent: Jun. 28, 1988

[54] DYNAMIC RANDOM ACCESS MEMORY REFRESH CIRCUIT SELECTIVELY ADAPTED TO DIFFERENT CLOCK FREQUENCIES

[75] Inventor: Nataraj Bhadriraju, Phoenix, Ariz.

[73] Assignee: GTE Communication Systems Corporation, Phoenix, Ariz.

[21] Appl. No.: 789,214

[22] Filed: Oct. 18, 1985

[51] Int. Cl.[4] .......................... G06F 12/16; G11C 7/00
[52] U.S. Cl. ...................................... 364/900; 365/222
[58] Field of Search ... 364/200 MS File, 900 MS File; 365/222

[56] References Cited

U.S. PATENT DOCUMENTS

| | | | |
|---|---|---|---|
| 3,729,722 | 4/1973 | Shuba | 365/222 |
| 3,760,379 | 9/1973 | Hibby et al. | 365/222 |
| 4,158,883 | 6/1979 | Kadono et al. | 364/200 |
| 4,249,247 | 2/1981 | Patel | 364/900 |
| 4,332,008 | 5/1982 | Shima et al. | 364/200 |
| 4,575,826 | 3/1986 | Dean | 365/222 |
| 4,628,482 | 12/1986 | Tachiuchi et al. | 365/222 X |

Primary Examiner—Raulfe B. Zache
Assistant Examiner—Florin Munteanu
Attorney, Agent, or Firm—Frank J. Bogacz

[57] ABSTRACT

A dynamic RAM memory refresh circuit is used with a microprocessor. In a small telecommunication switching system, a microprocessor shares access to memory with the dynamic RAM refresh circuit. Since circuitry size is of paramount importance, this circuit may be implemented with CMOS gate array technology. Since memory access is shared by the microprocessor and the dynamic RAM refresh circuit, processor through-put is affected. However, due to the speed of the dynamic RAM refresh circuit, the microprocessor real-time through-put is degraded only from 2 to 5 percent. A row of dynamic RAM memory is refreshed during each memory access by the refresh circuit, so that during a 2 millisecond inteval all dynamic RAM memory is refreshed. In addition, the dynamic RAM refresh circuit provides a strapping option to allow operation of the refresh circuit in conjunction with microprocessors of different clock frequency.

22 Claims, 7 Drawing Sheets

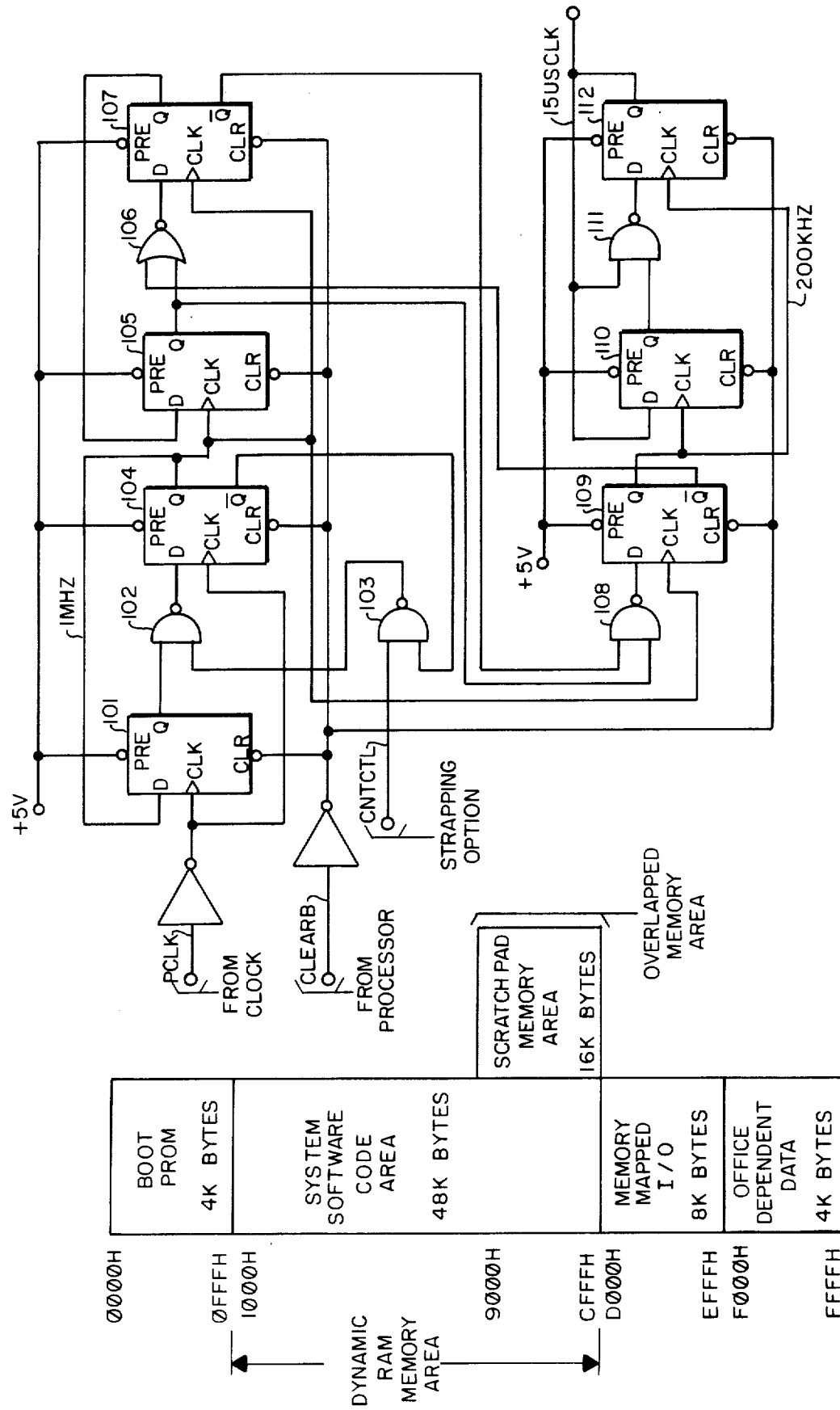

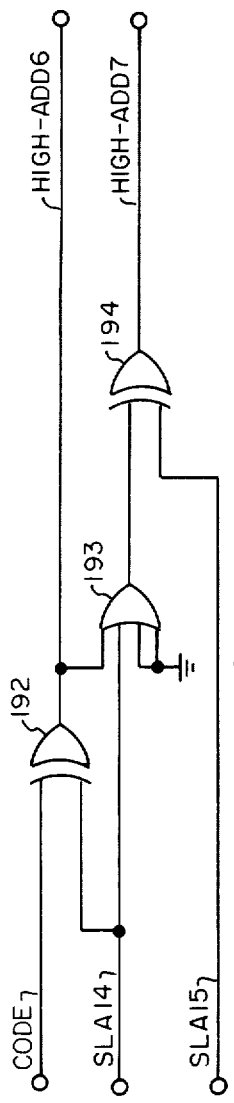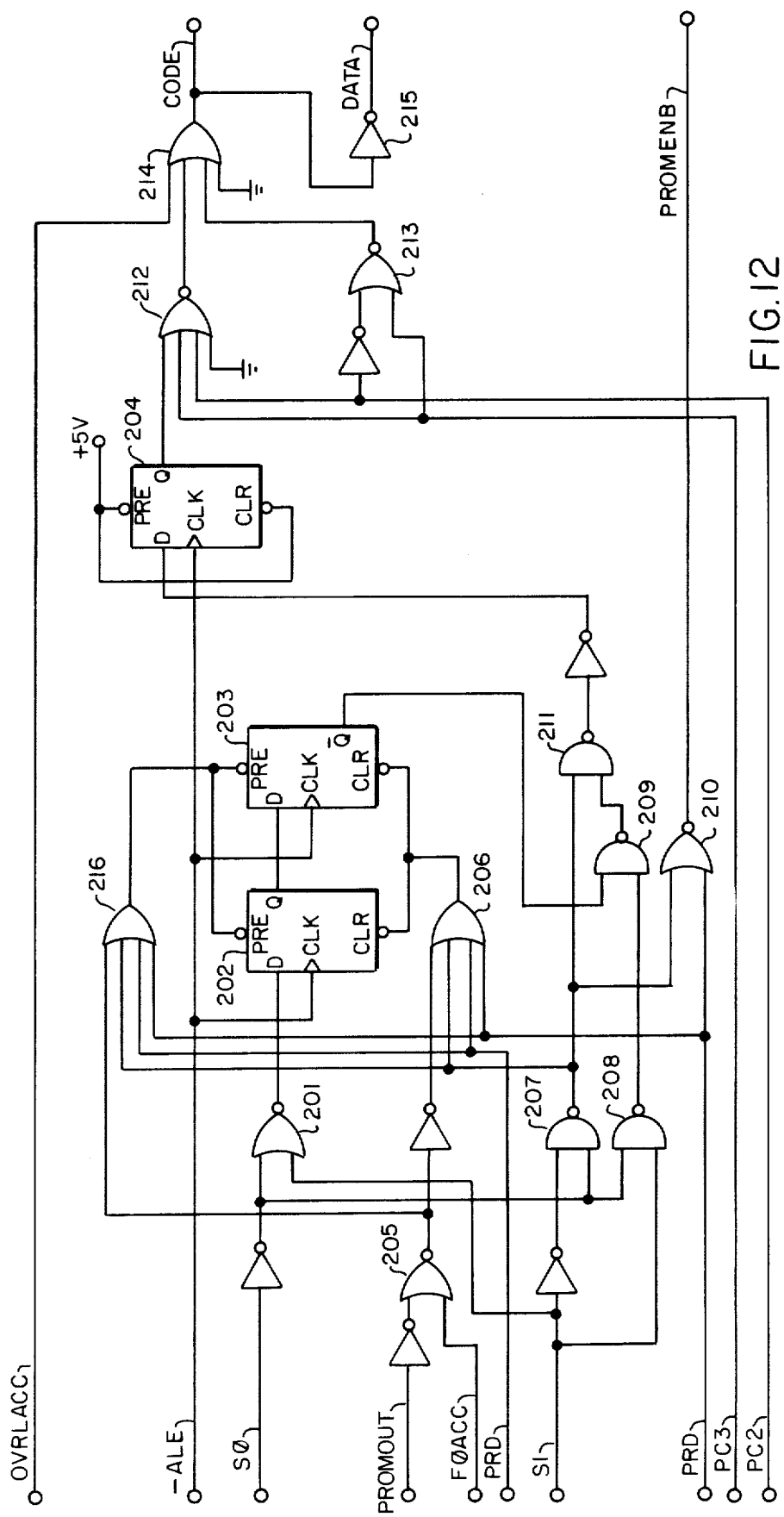

DYNAMIC RANDOM ACCESS MEMORY REFRESH CIRCUIT SELECTIVELY ADAPTED TO DIFFERENT CLOCK FREQUENCIES

CROSS-REFERENCE TO RELATED APPLICATIONS

The present application is related to copending U.S. application Ser. No. 789,213, now U.S. Pat. No. 4,698,749, which has the same inventive entity and is assigned to the same assignee as the present case.

BACKGROUND OF THE INVENTION

The present invention pertains to RAM memory accesses and more particularly to shared access of memory by a processor and refresh circuitry.

Developments in the semiconductor industry during past years have resulted in a major shift of the technology for storage elements used in digital processor control systems. Semiconductor random access memory (RAM) has been developed at a very rapid pace throughout the past decade. RAM's have led the way in the explosive growth of metal oxide semiconductor (MOS) devices and technology. Two major reasons for the wide acceptance of MOS devices are first, MOS devices are providing increased bit densities; and second, the MOS devices are decreasing in cost per bit of memory.

The two types of semiconductor RAM memory are static RAM and dynamic RAM. Data stored in dynamic RAM is stored as a charge on a capacitor of a particular memory cell. During a read or write operation, the charge on the capacitor is determined by sense amplifiers and is transmitted to an output buffer. Sensing the stored charge on the capacitor destroys the contents of a particular memory cell. Therefore, automatic restoration or refreshing operations are required to preserve dynamic RAM.

Static RAM offers the advantages of nonvolatility for access and real time speed since no refreshing operation is required. Data in static RAM is stored in a latch and therefore, requires more transistors per bit than does dynamic RAM. Static RAM's are commonly used in high speed applications. Typically, the power dissipation of a static RAM can be an order of magnitude more then that of an equivalent size dynamic RAM. Further, unlike dynamic RAM, static RAM does not employ address multiplexing and thereby requires a greater number of input/output operations and a larger package then does dynamic RAM for an equivalent size memory.

Therefore, in digital systems where very fast memory access time is not required, dynamic RAM is widely used in the industry today.

With the advent of the widespread usage of microprocessors to perform such operations as switching control in smaller remotely located digital multiplexer systems, cost and size of circuitry becomes very important. Commonly used microprocessors are those such as the Intel 8085 and Intel 8086 models. Dynamic RAM in such microprocessor control systems must be refreshed at least every 2 milliseconds. The present invention is a dynamic memory refresh circuit implemented on a 1500 gate, 5 micron complementary MOS gate array. The gate array is packaged for small size in a 68 pin chip carrier. Only 600 of the 1500 gates in the gate array ship were required for the dynamic memory refresh circuit.

SUMMARY OF THE INVENTION

In a digital processing system, a processor and clock control the transfer data between the processor and a dynamic RAM memory. The present invention is a dynamic RAM memory refresh circuit which is connected between the processor, the clock and the dynamic RAM memory. The dynamic memory refresh circuit operates in conjunction with the processor to share access to the dynamic RAM memory. This shared access provides for a minimum of real time degradation of the processor through-put due to memory refreshing.

The refresh circuit includes a timer, control logic, an address generator and an address selector. The timer is connected to the processor clock and to the processor. In response to the processor clock, the timer transmits a periodic signal of a particular frequency.

The control logic is connected between the timer and the processor. The control logic operates in response to the periodic signal to transmit a hold request signal to the processor for suspending the processor's data transfer operation. This suspension allows the refresh circuit to refresh one particular row of dynamic RAM memory.

The address generator is connected to the timer and to the processor. The address generator operates in response to the periodic signal to produce one address of a sequence of addresses. The locations corresponding to the one produced address (a row) are refreshed during a particular dynamic RAM memory access by the refresh circuit.

The control logic operates in response to a hold acknowledge signal the processor to transmit an address select signal to the address selector. The hold acknowledge signal is produced by the processor in response to the hold request signal. The address selector is connected to the control logic and to the dynamic RAM memory. The address selector operates to transmit the refresh address or the processor address to the dynamic RAM memory for memory access. In response to the processor's hold acknowledge signal and to the address select signal, the address selector transmits the address of the dynamic RAM memory locations to be refreshed.

DESCRIPTION OF THE DRAWINGS

FIG. 5 is a memory organization map of the system containing the present invention.

FIG. 6 is a schematic diagram of the refresh timer circuitry shown in FIG. 2.

FIG. 11 is a schematic diagram of the adder circuit 26 shown in FIG. 2.

FIG. 12 is a schematic diagram of the code/data overlay logic 28 shown in FIG. 2.

DESCRIPTION OF THE PREFERRED EMBODIMENT

Figure 1:
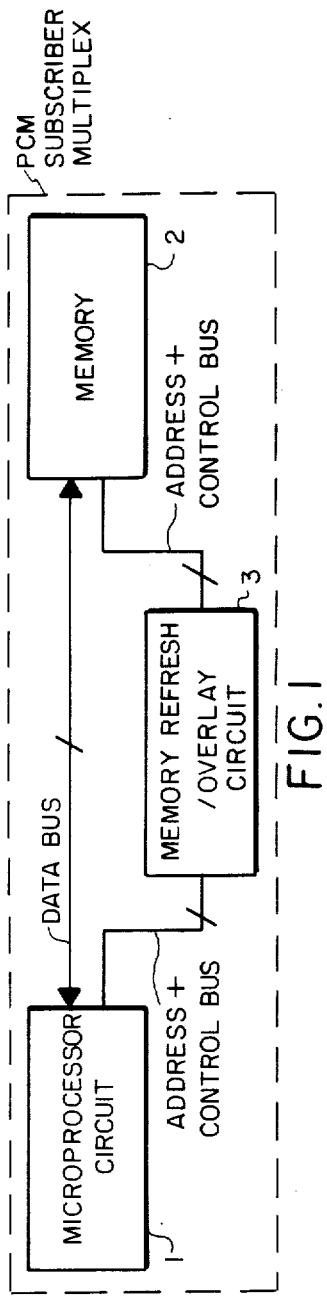
FIG. 1 is a block diagram of the digital processor control of a PCM subscriber multiplex.

Referring to FIG. 1, a block diagram of the control portion of a PCM subscriber multiplexer is shown. Simplistically speaking, the control portion of the multiplexer contains a microprocessor circuit 1 which is connected via data bus to memory 2. Typically, the microprocessor address and control bus would be connected directly to the memory. However, in the present invention these buses are intercepted by the memory refresh/overlay circuit 3. That is, the address and control buses are routed from microprocessor 1 to memory refresh/overlay circuit 3 where they are manipulated to perform dynamic RAM memory refreshing and a memory overlay or enlargement scheme. These buses are then transmitted from memory refresh/overlay circuit 3 to the memory 2 to perform the desired memory accessing function.

The PCM subscriber multiplexer is a remotely located switching mechanism which connects up to 96 subscriber lines on to a particular T1 span for switching operations by a central switching office. The control portion of the multiplexer performs the required software functions for the multiplexer system. The heart of the microprocessor circuit 1 is an Intel 8085 microprocessor. Intel is a registered trademark of the Intel Corporation. An Intel 8086 microprocessor is also adaptable for use in the present invention. The microprocessor circuit 1 together with the memory 2 provides the decision making logic for the multiplexer system. All processing, routing, supervision and administrative functions are performed by the microprocessor circuit 1 in conjunction with a host processor located at the central office. The microprocessor circuit 1 and the host processor communicate via a dedicated channel of a T1 span. The program code for operating the multiplexer is stored at the central office and is transmitted to the multiplexer system via the T1 data link during a power up start phase. This program is then stored in dynamic RAM memory located within the multiplexer. The only permanently resident program in the multiplexer is located in PROM memory and is the boot strap for loading and reinitializing the multiplexer software after a power up.

Figure 2:
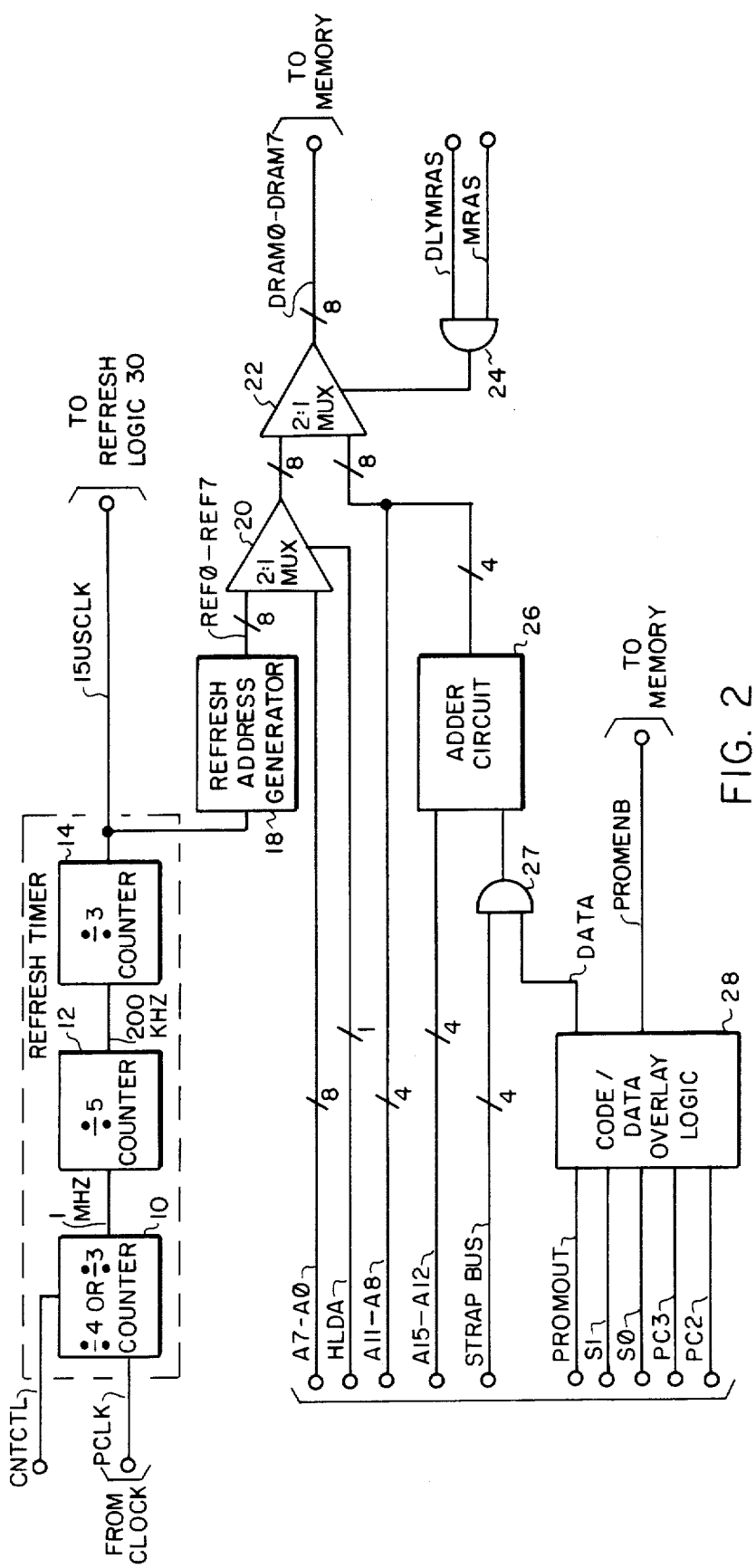
FIG. 2 is a block diagram of a portion of the refresh and overlay logic of the memory refresh/overlay circuit.

Referring to FIG. 2, the REFRESH TIMER comprises three stages. The first stage is a programmable synchronous counter 10 which divides the input processor clock signal PCLK by four or by three. Counter 10 renders this circuit flexible for use with an Intel 8085 microprocessor which requires a 3 MHz clock signal or an Intel 8086 microprocessor which requires a 4 MHz clock signal. The programmable counter 10 provides a strapping option via the CNTCTL lead for determination of whether the counter 10 divides by three or four.

If the CNTCTL lead is strapped to a logic low, counter 10 operates as a divide by three counter. If the CNTCTL lead is strapped to a logic high, counter 10 operates as a divide by four counter. Counter 10 is connected to divide by five counter 12 via the 1 MHz lead. The frequency of the signal output by counter 10 is now 1 MHz.

The second stage of the REFRESH TIMER is a synchronous divide by five counter 12. Divide by five counter 12 takes the 1 MHz signal input and produces a 200 KHz signal as an output on the 200 KHz lead.

The 200 KHz lead connects divide by five counter 12 to divide by three counter 14. The last stage of the REFRESH TIMER, counter 14, produces a 15 microsecond clock on the 15 USCLK lead. This 15 microsecond clock is input to the refresh address generator 18.

In order for data to be retained by the dynamic memory, each memory cell must be refreshed at least once every 2 milliseconds. The memory is organized such that there are 128 rows of storage cells. Refreshing one row of the 128 rows of storage cells will refresh all cells associated with that row. If each of the 128 rows of memory is refreshed sequentially every 15 microseconds, all rows will be refreshed within the required 2 millisecond refresh time period.

The refresh address generator 18 produces the address of the row to be refreshed during each memory refresh cycle (15 microsecond). To address 128 rows of memory, 7 bits are required. Address bits are REF0 through REF6 are required to access the 128 rows of the dynamic RAM memory. The 8th bit, REF7, although transmitted to the memory, is functionally irrelevant to determining which of the 128 rows of memory cells to be refreshed.

Refresh address generator 20 is an 8-bit binary down counter. The use of all 8 address bits by counter 20 permits further expansion of this gate array to the full 256K dynamic RAM memory. The clock signal on the 15 USCLK lead is input to the refresh address generator 20. Address generator 20 is clocked, so that it is decremented once each 15 microseconds. Generator 20 provides an address for each of the 128 rows to be refreshed in response to the clock pulse input on the 15 USCLK lead. On each successive count of the 15 microsecond clock, generator 20 will decrement the address of the row to refresh by one and output that address on the address bus REF0 through REF7. In response to being addressed each row of memory the memory cells of that row are refreshed.

Figures 3, 4:
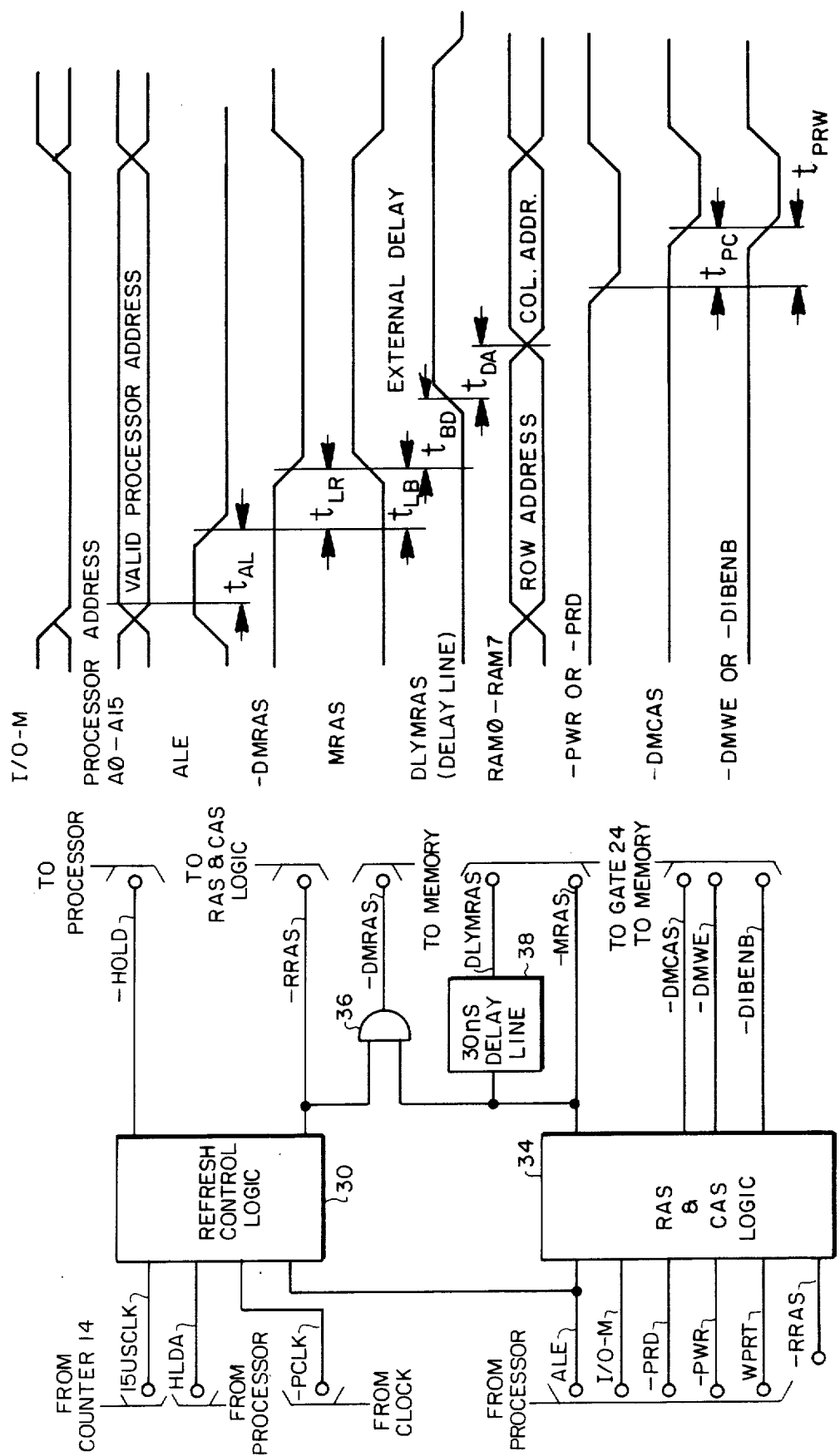
FIG. 3 is a block diagram of the control portion of the memory refresh/overlay circuit.
FIG. 4 is a timing diagram of various signals which control the operation of the memory refresh/overlay circuit.

As shown in FIGS. 2 and 3, the refresh control logic 30 sends an active low hold request signal via the HOLD lead to the processor every fifteen (15) microseconds. Refresh control logic 30 is connected to counter 14 via the 15 USCLK lead. The microprocessor circuit (processor) is also connected to an input of the refresh control logic 30 via the hold acknowledge (HLDA) lead. The refresh control logic is connected to the clock via the PCLK lead.

In response to the 15 microsecond clock, the refresh control logic 30 generates the HOLD signal which is transmitted to the processor. The HOLD signal has the effect of inhibiting processor's access to memory. This allows the refresh circuit to refresh one row of the dynamic RAM memory. Since, the hold request is generated asynchronously to the processor's operation, the refresh circuit must wait until the end of a processor instruction cycle before the processor relinquishes its control to the refresh circuit. When the processor is ready to relinquish control, it responds with a signal on the hold acknowledge (HLDA) lead. For proper operation of the refresh circuit an assumption is made that the real time of the processor is such that the processor will acknowledge the hold request well within the 15 microsecond period before the next hold request is transmitted to the processor by refresh control logic 30.

For example, assuming that the processor has just begun processing its longest instruction, an 8085 microprocessor running at a clock rate of 3 MHz will in the worst case acknowledge hold after seventeen clock cycles or approximately six microseconds. The dynamic RAM memories typically require between 150 nanoseconds to 200 nanoseconds minimum pulse width for the refresh operation. This circuit minimizes the required time by generating a refresh pulse for particular row merely one clock cycle after the hold acknowledge signal is given by the processor. As a result the processor is held for no greater than 2 clock cycles for the refreshing operation which results in only a 2 to 5 percent degradation of processor through put due to the RAM refresh operation.

The outputs of refresh address generator 18 (REF0 through REF7) are transmitted to multiplexer 20 via a corresponding bus. In addition, the low byte leads of the processor address bus (A0 through A7) are connected as another input to 2-to-1 multiplexer 20. The processor is connected to multiplexer 20 via the hold acknowledge (HLDA) lead. A value of logic 0 of the hold acknowledge signal indicates that the low byte of the processor's address is to be gated through multiplexer 20. A value of logic 1 of the hold acknowledge signal indicates that the refresh address bus (REF0 through REF7) is to be gated through multiplexer 20.

In order to refresh a memory location, the next falling edge of the PCLK signal after the hold acknowledge (HLDA) signal has been received by refresh control logic 30, logic 30 will generate a logic 0 on the RRAS lead which is connected to AND gate 36. The RRAS signal when combined with MRAS signal will generate the DMRAS signal which strobes the refresh address into the memory.

The 8-bit output of multiplexer 20 is connected to multiplexer 22 via the low byte 8-bit bus. The other input to multiplexer 22 is the processor high-byte 8-bit bus address. The output of multiplexer 22 is connected to the memory via the 8-bit bus DRAM0 through DRAM7. Control of multiplexer 22 is established by AND gate 24 which produces a logic 0 value for gating out the low byte to memory and the value of logic 1 to gate the high byte of the addressed memory. AND gate 24 is controlled by the MRAS signal generated by the RAS and CAS logic 34 and by an externally delayed version of the MRAS signal, called the DLYMRAS signal.

For normal address transmission from the processor to memory, the low byte is first transmitted from the processor on address leads A0 through A7 through multiplexer 20 via the low byte bus through multiplexer 22 via the DRAM bus to the memory. When the high byte of the processor address is output on address leads A8 through A15, it is transmitted through multiplexer 22 via the high byte bus in response to the operation of AND gate 24 for a logic 1. The high byte is then transmitted via the DRAM bus to the dynamic RAM memory.

In order for the processor to access a memory location, the processor outputs the address on the address bus and indicates the presence of the valid address on the bus via the address latch enable (ALE signal). See FIG. 4. The address on the address bus is valid and stable on the falling edge of the ALE signal. This falling edge of the ALE signal is used by the RAS and CAS logic to generate the MRAS signal. The MRAS signal ANDED with gate 36 generates −DMRAS signal which is used to strobe the low byte of address information through multiplexer 22 to the dynamic RAM memory.

The 30 nanosecond delay line 38 is connected to RAS and CAS logic 34 via the MRAS lead. In response to the MRAS signal, the DLYMRAS signal is generated which is a delayed version of the MRAS signal by 30 nanoseconds. When DLYMRAS signal goes high, multiplexer 22 which is connected to gate 24 selects the high byte of the processors address and transmits the address to the dynamic RAM memory.

The processor's memory access consists of either a READ or a WRITE operation from the dynamic RAM memory. See FIG. 4. In either event, one of the signals from the processor will go active low (PRD for a processor read operation and PWR for a processor write operation). The falling edge of either one of these signals (−PRD or −PWR) is used to generate an active low signal DMCAS which strobes the high byte of the processor's address into the dynamic RAM memory. During the write cycle, the data from the processor is written into the addressed location on the rising edge of the −PWR signal. If the PWR signal is inactive, the dynamic RAM defaults to a read cycle operation. For a read operation by the processor, data from the dynamic RAM memory is latched into the processor on the rising edge of the −PRD signal. The rising edge of either the −PWR signal or −PRD signal will complete the process of memory access and reset all flip-flops internal to the CAS and RAS logic 34. The WPRT control signal from the processor when activated disables the write operation to the program memory.

Referring again to FIG. 2, adder circuit 26 is connected between AND gate 27 and multiplexer 22. AND gate 27 is 4 bits wide and is connected to sources of logic 0 and logic 1 so as to construct a 0100 binary pattern, which is equivalent to a numeric four. AND gate 27 is also connected to code/data overlay logic 28 via the DATA lead. When AND gate 27 is enabled by the signal on the DATA lead, AND gate 27 inputs a four-bit wide binary equivalent of the number 4 to adder circuit 26.

FIG. 4 shows that during a write access operation, the low active DMWE signal used to write the data into the dynamic RAM memory and during the read access operation, the active low DIBENB signal is used to enable the tristate data bus for receipt of data by the processor. The PROMENB enables access to a PROM memory for determining whether the processor current instruction is a multi-byte instruction or a single byte instruction. This signal generates the PROMOUT signal input to code/data overlay logic 28.

FIG. 5 depicts the system memory organization. The software boot strap is located in a PROM memory (not shown) processor addresses from 0H to 0FFFH. This represents 4K bytes of memory. Memory locations 1000H through CFFFH contain the system software program code. The system software code represents 48K bytes of memory. Memory locations D000H through EFFFH contain the memory mapped I/O locations. The memory mapped I/O locations comprise 8K bytes.

Data base in the form of office dependent data is contained in the remaining 4K bytes of static RAM memory beginning with the memory location F000H and continuing to FFFFH.

Within the system software code area (48K bytes from locations 1000H to CFFFH), a particular area is used as scratch pad memory and effectively overlaid on top of the program code area. This area is 16K bytes in length and spans from locations 9000H to CFFFH. The overlay is such that the processor address output is the same for the program code or the scratch pad area. The memory are physically separate, but address using the same address. The total memory area comprises 80K bytes of memory. Out of that 64K bytes is dynamic RAM memory comprising of 48K bytes of code and 16K bytes of scratch pad.

Typically, program operation codes are fetched from the system software code area and no writing is performed within this area. For efficiency and minimally sized memory considerations, it is advantageous to overlay a portion of the system software code area with writeable scratch pad memory. The processor addresses a particular area for scratch pad memory. In response the overlay logic 28 relocates the processor's address to a different area of dynamic RAM memory for the particular data access. In this way both code and data can be accessed by the processor via the same processor address. This scheme effectively doubles the possible size of the memory associated with the processor. One bank of memory may contain program code and the other bank may contain data.

During an OPCODE fetch operation to the memory, the processor status bits S0 and S1 are both at logic 1. Reference table 1 below.

TABLE 1

| PROCESSOR STATUS BITS | | | |
|---|---|---|---|
| S0 | S1 | IO/M | REMARKS |
| 1 | 1 | 0 | OPCODE FETCH |
| 0 | 1 | 0 | MEMORY READ |
| 1 | 0 | 0 | MEMORY WRITE |

I/O-M=1 disables the access to the memory. The status bits S0 and S1 are decoded by overlay logic 28 of FIG. 2 as an OPCODE fetch operation. A logic 0 is produced on the DATA lead which is transmitted to AND gate 27. A logic 0 on the DATA lead inhibits AND gate 27 from operating and thereby adder circuit 26 does not add the value of 4 to the upper half of the high address byte (A12-A15). As a result, the OPCODE fetch operation occurs normally from the proper address within the dynamic RAM memory.

During the OPCODE fetch operation, a logic 1 on the PROMEMB lead is generated on the following edge of the PRD signal. Reference FIG. 4. The PROMENB signal is externally used to latch the OPCODE read from memory. The latched OPCODE is then used as an address to the PROM which will decode this OPCODE and produce the PROMOUT signal which will determine whether the OPCODE fetched from memory is a single byte instruction or a multi-byte instruction. This signal is an input to the Data/Code overlay logic. This determination is important for all ranges in which code and data are overlaid (that is, they have the same addresses possible). In the Intel 8085 application, for a single byte OPCODE fetch, the next memory read is from the data bank of the memory. A write operation is always to the data bank of the memory, except during a program loading operation. For multi-byte instructions, the OPCODE fetch operation is followed by two reads from the program code area or one read from the code area followed by a write to the data area of memory.

For accesses (either memory read or memory write) to the data area, the DATA signal is at logic 1 and AND gate 27 is enabled to add the particular offset value on the 4 bit strapping bus. In the general case, any offset value is possible depending upon the extent of the implemented scratch pad memory area. In this case, it is the value 4 in the upper half of the high byte of the address.

In FIG. 2 adder circuit 26 adds the value 4 in the high order nibble of the upper byte of address to value of the address transmitted by the processor. As a result, the processor accesses a particular area which for an OPCODE fetch would contain program code; however, the address is offset by adder circuit 26. The data is then read from a different location of the dynamic RAM memory based upon the value of the status bits of the processor and PROMOUT. It is assumed for the above code and data overlay scheme that the derived processor control signals PC2 and PC3 are both at logic 1. These signals are generated by other logic intermediate to the processor and the overlay logic (not shown). For the possible values of the processor control signals reference Table 2.

TABLE 2

| PROCESSOR CONTROL SIGNALS | | | |
|---|---|---|---|
| PC2 | PC3 | Code Access or Data Access | |
| 0 | 0 | Data | For data initialization; Address Offset |
| 0 | 1 | Code | For loading code; No Offset |
| 1 | 0 | Data | For loading data; Address Offset |
| 1 | 1 | * | Program execution; Offset only during data access under program control. |

The DMWE and DIBENB signals are inhibited for the memory access in the range of locations 0000H through 0FFFH and D000H through FFFH. Reference the memory map in Table 3.

TABLE 3

| MEMORY MAP | |
|---|---|
| Address | Remarks |
| 0000H | −DMWE and −DIBENB signals are inhibited |
| o | |
| o | |
| o | |
| 0FFFH | |
| 1000H | Code area. −DIBNB signal always enabled. |
| o | −DMWE signal enabled except for WPRT=1. |
| o | |
| o | |
| 8FFFH | |
| 9000H | Code and Data overlay area. |
| o | −DIBENB signal always enabled. |
| o | −DMWE signal can be inhibited if WPRT=1 |
| o | However, −DMWE signal will be enabled even |
| CFFFH | if WPRT=1, if the access is to data. |
| D000H | −DMWE and −DIBENB signals are inhibited. |
| o | |
| o | |
| o | |
| FFFFH | |

Again, for access to data memory the address in the range 9000H through CFFFH is offset by 4000H by adder 26 before the address is transmitted to the dynamic RAM memory. Note that for code access to the same locations the address is not offset by adder 26. The high going edge of either PWR or PRD signals will end the processor access to memory. Reference FIG. 4.

FIG. 6 depicts the logic implementations of the refresh timer shown in FIG. 1. The PCLK lead is connected to the clock input of D-type flip-flop 101. The strapping option CNTCTL lead is connected between logic 0 or logic 1 and NAND gate 103. NAND gate 103 is connected to NAND gate 102. The reset signal CLEARB is connected to the clear input of each D-type flip-flop 101, 104, 105, 107, 109, 110 and 112.

The PCLK signal is either a 3 MHz or 4 MHz signal from the processor clock. For a 3 MHz PCLK signal, the CNTCTL lead is strapped to a logic 0 and for a 4 MHz PCLK signal, the CNTCTL lead is strapped to a logic 1. NAND gate 102 is connected to the D input of flip-flop 104. As a result, for either a 4 or 3 MHz PCLK signal input, flip-flop 104 produces a 1 MHz signal on the Q output. Flip-flops 101 and 104 produce the divide by 3 or 4 function.

The Q output of flip-flop 104 is connected to the clock input of flip-flops 105, 107 and 109. The Q output of flip-flop 105 is connected to NOR gate 106. The output of NOR gate 106 is connected to the D input of flip-flop 107. The clock input of flip-flop 107 is connected to the Q output of flip-flop 104. The Q output of flip-flop 107 is connected to the D input of flip-flop 105. The −Q output of flip-flop 107 is connected to one input of NAND gate 108. The other input to NAND gate 108 is connected to the Q output of flip-flop 105. The output of NAND gate 108 is connected to the D input of flip-flop 109. The clock input of flip-flop 109 is connected to the Q output of flip-flop 104. The Q output of flip-flop 109 is connected to the clock input of flip-flop 110 and provides the 200 KHz output signal. Flip-flops 105, 107 and 109 along with gates 106 and 108 provide a divide by 5 function.

The −Q output of flip-flop 109 is connected to one input of NOR gate 106. As a result of the input PCLK signal 3 or 4 MHz, the Q output of flip-flop 109 is now a 200 KHz signal.

The 200 KHz signal is also transmitted via a connection from the Q output of flip-flop 109 to the clock input of flip-flops 110 and 112. The Q output of flip-flop 110 is connected to one input of NAND gate 111. The output of NAND gate 111 is connected to the D input of flip-flop 112. The Q output of flip-flop 112 on the 15 USCLK lead is a 15 microsecond signal which is used to generate hold request to the processor for refreshing dynamic RAM memory and generating refresh address. The Q output of flip-flop 112 is also connected to the second input of NAND gate 111 and the D input of flip-flop 110. Flip-flops 110 and 112 and gate 111 provide the 15 microsecond clock signal.

Figure 7:
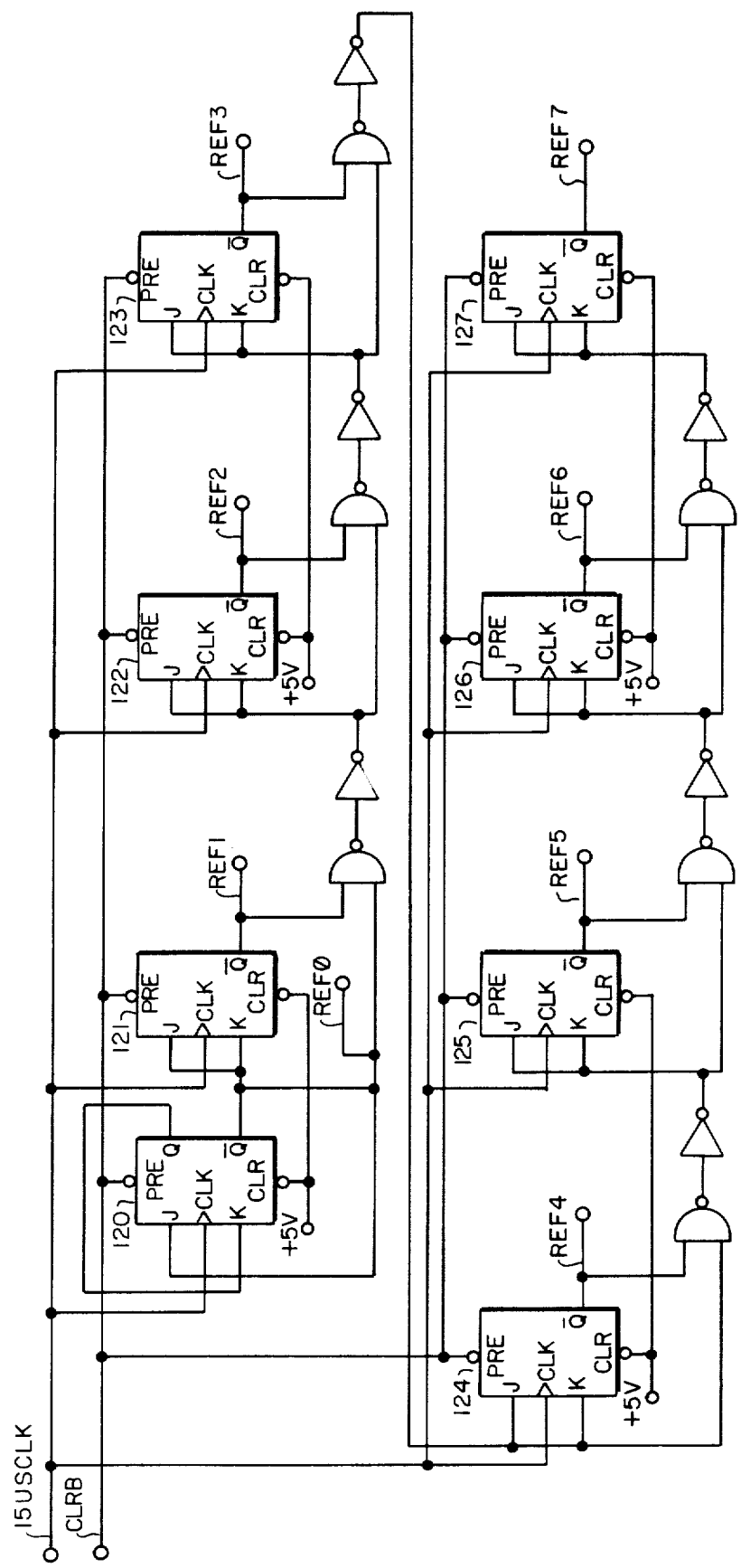
FIG. 7 is a schematic diagram of the refresh address generator 18 shown in FIG. 2.

FIG. 7 depicts the details of the refresh address generator 18 shown in FIG. 2. Flip-flops 120 through 127 form a synchronous 8-bit binary down-counter. Each flip-flop 120–127 has its CLK input connected to the 15 microsecond clock signal via the 15 USCLK lead. The clear signal is connected via the CLRB lead to the preset input of each flip-flop 120–127. The −Q output of each flip-flop 120–127 produce one refresh address lead output REF0-REF7 respectively. For refreshing 64K of dynamic RAM memory 7 bits of address information are required. However, 8 bits of addressing information are produced via the REF0 through REF7 leads. The most significant address bit (REF7) is insignificant for the particular operation of the disclosed circuit and is therefore a don't care function. Since the implemented design is a modulo 255 counter the low order 7 bits are effectively a modulo 127 counter required to refresh 64K of a dynamic RAM. The 8-bit REF7 maybe used for extended memory applications up to 256K of dynamic RAM.

Each flip-flop of the refresh generator 18 is clocked on the rising edge of the 15 USCLK lead. As a result, each refresh lead REF0 through REF7 outputs the address required to refresh the dynamic RAM memory. Each successive appearance of the 15 USCLK lead decrements the address output on leads REF0 through REF7 by 1. Therefore, a new address is output to multiplexer 20 at each 15 microsecond time period. As dynamic RAM memory is accessed via an address, it is automatically refreshed. The CLRB signal can be used to clear flip-flops 120 through 127 on power-up.

Figure 8:
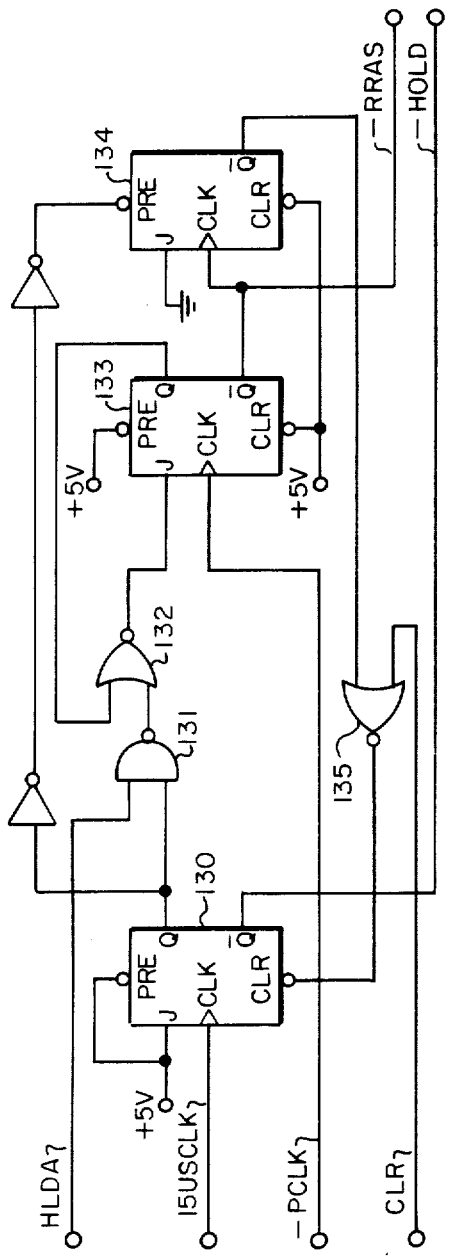
FIG. 8 is a schematic diagram of the refresh control logic 30 of FIG. 3

FIG. 8 shows the details of the refresh control logic 30 of FIG. 2. The 15 USCLK lead is connected to flip-flop 130. The −Q output of flip-flop 130 produces the active low hold request signal on the HOLD lead which is transmitted to the processor. The processor inverted clock signal is transmitted to the clock input of flip-flop 133 via the −PCLK lead.

When the processor responds to the hold request via the hold acknowledge signal on the HLDA lead, it is transmitted through NAND gate 131, through NOR gate 132 and latched in flip-flop 133 on the next falling edge of PCLK signal. The −Q output of flip-flop 133 is the active low −RRAS signal which is transmitted to RAS and CAS logic 34. The −RRAS signal gated through RAS and CAS logic 34 generates the RAS signal for one period of PCLK which will strobe the refresh address into the dynamic RAM.

Flip-flop 133 has its −Q output connected to the clock input of flip-flop 134. The −Q output of flip-flop 134 is connected through NOR gate 135 to the clear input of flip-flop 130 at the end of refreshing cycle to remove hold request to the processor. Either the CLR signal or the −Q output of flip-flop 134 will be gated through NOR gate 135 and reset flip-flop 130 for the occurrence of the next 15 microsecond clock period.

Figure 9:
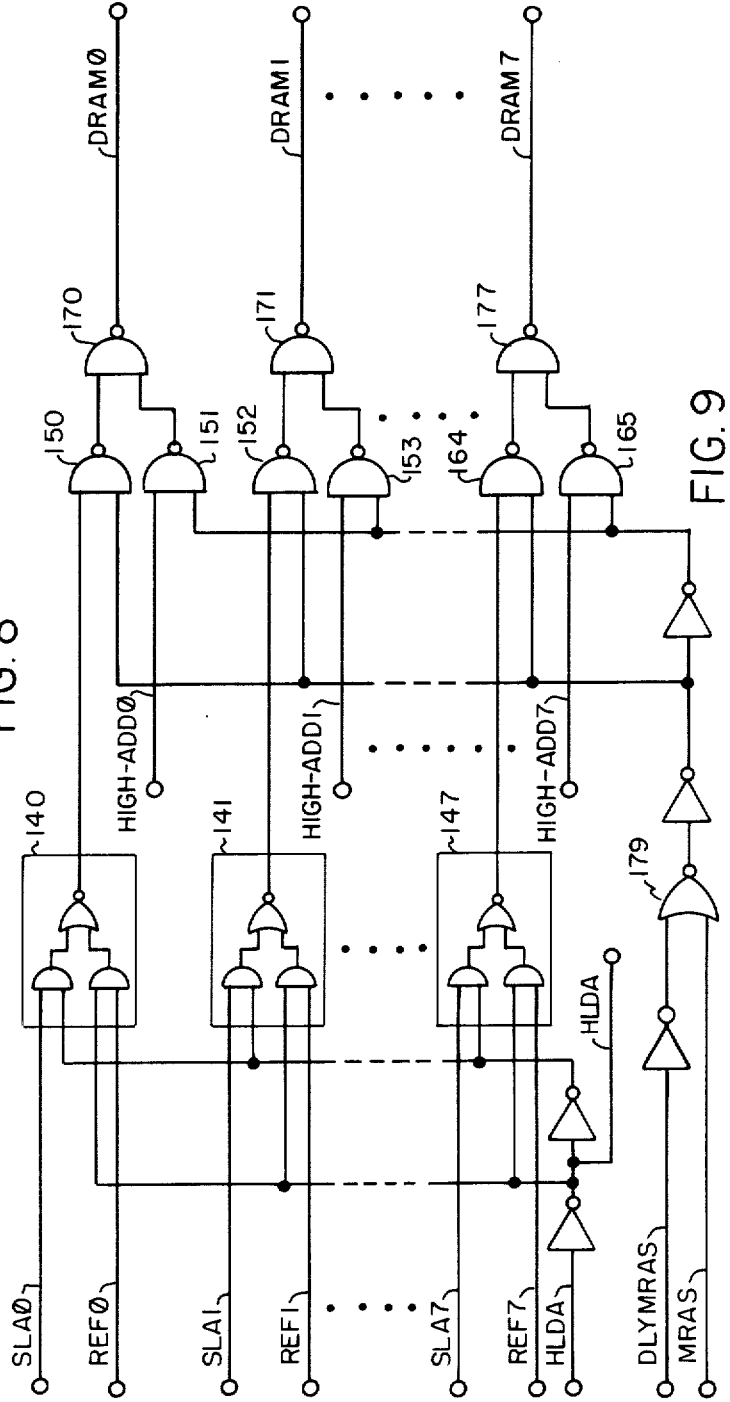
FIG. 9 is a schematic of the address multiplexers 20 and 22 shown in FIG. 2.

FIG. 9 depicts the details of multiplexers 20 and 22 of FIG. 2. Multiplexer 20 is comprised of NOR gate combinations 140 through 147. Combination gates 142 through 146 are not shown. Processor address bit 0 (SLA0) is input to combination gate 140 along with refresh address bit 0 (REF0). The status of the hold acknowledge signal HLDA determines which of the address bits is gated through multiplexer 20.

If the HLDA lead is active (logic 1) refresh bit 0, REF0 signal, is gated through combination gate 140 to the input of NAND gate 150. Combination gates 141 through 147 operate similarly with address bits SLA1 through SLA7 and refresh bits REF1 through REF7, respectively. For an inactive hold acknowledge signal HLDA equal logic 0, the processor address bit SLA0 is transmitted through combination gate 140 to NAND gate 150. And similarly, for processor address bits SLA1 through SLA7 and combination gates 141 through 147, respectively.

The DLYMRAS signal and the MRAS signal control the second stage multiplexing, multiplexer 22. Multiplexer 22 is comprised of NAND gates 150 through 165 and 170 through 177. The output of combination gates 140 through 147 is connected to NAND gates 150-164 (even numbered ones only). Each of the odd numbered NAND gates 151 through 165 is connected to one of the bits of the high byte of the processor address (HIGH-ADD0 through HIGH-ADD7).

NAND gates 150 and 151 are connected to the inputs of NAND gate 170. For a processor access of the memory, the HLDA is inactive (low). As a result, the processor low-byte address bits SLA0 through SLA7 are gated through the NAND gates 170-177 on the DRAM0 through DRAM7 leads and transmitted to the dynamic RAM memory. After the low-byte is strobed into the DLYMRAS signal goes active and gates processor high-byte address on the DRAM0 through DRAM7 leads to the dynamic RAM.

For a active HLDA signal, the refresh address bits REF0 through REF7 are gated through NAND gate 170-177 on the output leads DRAM0 through DRAM7. For an active DLYMRAS and an active MRAS signal the high address bits (HIGH-ADD0 through HIGH-ADD7) 1 are gated through on to the DRAM0 through DRAM7 leads.

Figure 10:
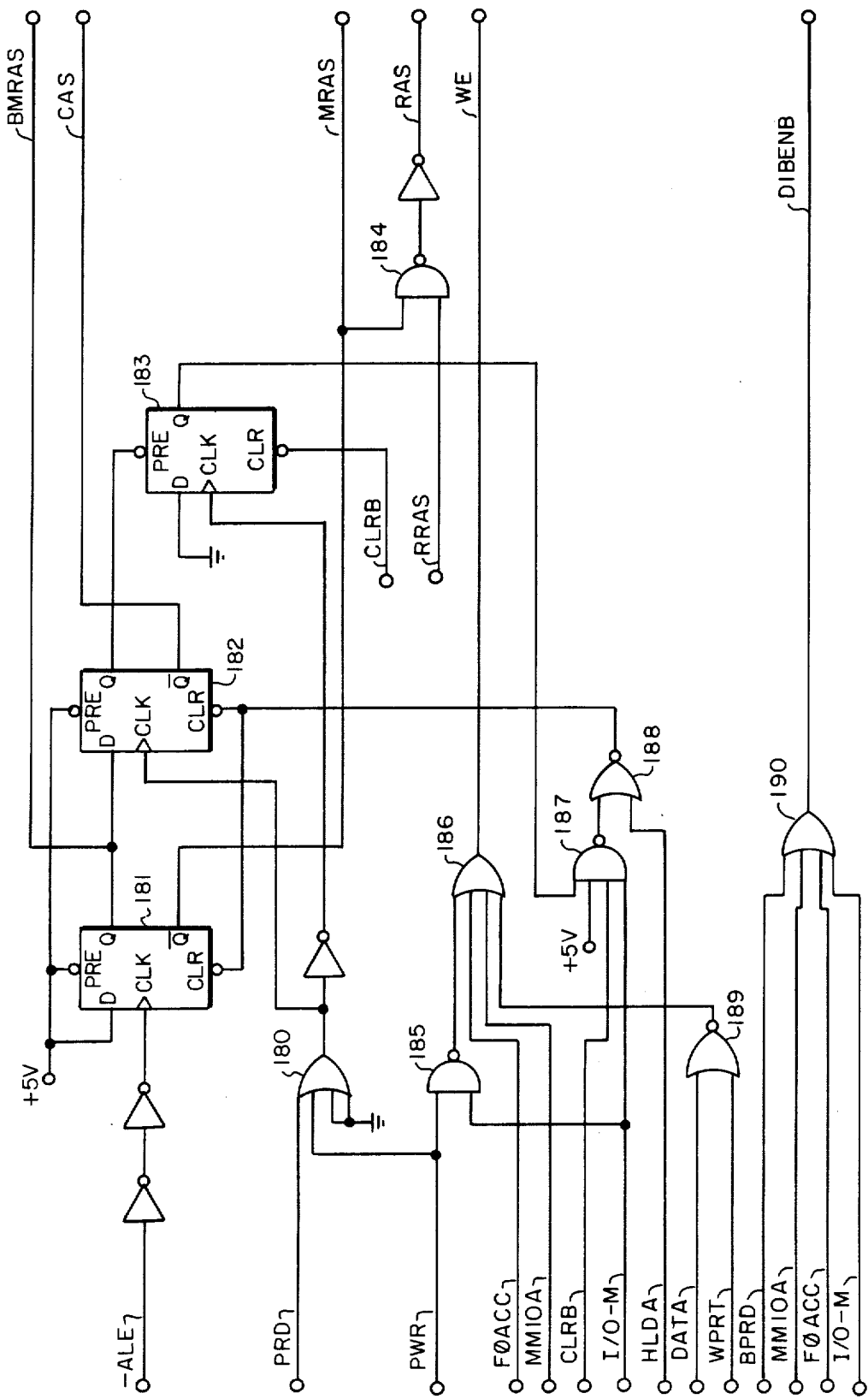
FIG. 10 is a schematic diagram of the RAS and CAS logic 34 shown in FIG. 3.

FIG. 10 is a detailed schematic of the RAS and CAS logic 34 of FIG. 2. Some of the input signals to this logic are developed by the microprocessor circuit. The MMIOA signal is normally low except for processor addresses in the range of D000H through EFFFH which is reserved for the memory mapped I/O locations. If the MMIOA signal is high, then the read and write control signals (PRD and PWR) from the processor are disabled. Similarly, the FOACC signal is normally low, except for processor addresses in the range from 0000H through 0FFFH and F000H through FFFFH, which are reserved for dedicated processor ROM and RAM applications.

For typical accesses of a memory location, the HLDA and I/O-M signals will be at logic 0. The address will be put on the address bus and the falling edge of the ALE signal indicates that the address is valid. The ALE signal clocks flip-flop 181 and the −Q output of flip-flop 181 is the MRAS signal. The Q output of flip-flop 181 is connected to the D-input of flip-flop 182 and is the intermediate control output BMRAS. The −Q output of flip-flop 182 is the column address select signal CAS.

The −Q output of flip-flop 181 is connected to NAND gate 184 along with the RRAS lead from the refresh control logic 30 of FIG. 3. They are combined by NAND gate 184 to produce the row address select signal RAS. The processor read signal PRD is connected through NOR gate 180 to the clock input of flip-flop 182 and an inverted form is transmitted to the clock input of flip-flop 183.

The processor write signal PWR is connected to inputs of OR gate 180 and to NAND gate 185. The I/O-M lead is connected to an input of NAND gate 185 and to NAND gate 187. The WPRT signal is connected to an input of NOR gate 189 along with the derived DATA signal from the code/overlay logic 28. Gate 189 is connected to an input of gate 186 along with the FOACC signal and the MMIOA signal. The FOACC and MMIOA signals are produced as a decode of the microprocessor address. The output of gate 186 produces the write enable signal transmitted to memory.

The clear signal CLRB is input to NAND gate 187 along with the I/O-M signal and the Q output of flip-flop 183. The output of gate 187 is used to clear flip-flops 181 and 182 through NOR gate 188. The HLDA signal is connected to the other input of NOR gate 188. The PRD, MMIOA, FOACC and I/O-M signals are a logically combined by OR gate 190 to produce the DIBENB signal for strobing memory.

Shown in FIG. 11, is a detailed schematic of the adder circuit 26 of FIG. 2. Although, for the present invention only two address-bits requires modification for code and data overlaying, this scheme is readily adaptable to completely overlay all locations of code and data memory.

During a data access, from the area in which program code typically resides, the CODE signal is at logic 0. The CODE signal along with address bit SLA14 from the processor are connected to exclusive OR gate 192. When a data access, is requested, address bit SLA14 is incremented by 1 and as result the output of exclusive OR gate 192 is a new high address bit 6 (HIGH-ADD6). In addition, the new high address bit 6 is combined with the old address bit SLA 14 by AND gate 193 to carry any overflow from this addition operation. The overflow from this addition is carried into address bit 15 SLA15 via a connection from the output of gate 193 to an input to exclusive -OR gate 194, where it is also exclusive -OR'ed with the existing value of address bit 15 to produce the high order bit of the high byte of address (HIGH-ADD7). This operation has effectively added 4000H to the address that was present on address leads SLA0 through SLA15.

FIG. 12 is a schematic showing the details of implementation of the code/data overlay logic 28 of FIG. 2. The overlay active signal (OVRLACC) is normally at logic 1 and is generated as a decode of the microprocessor address. If this signal is at logic 0, the current processor access is indicated to be within the range of the overlaid memory and data, in this case 9000H through CFFFH. If the overlay active signal OVRLACC is at logic 1, then the CODE signal is at logic 1 and adder circuit 26 will not add any offset to the processor address. The processor address may be offset by the adder circuit 26, if the overlay active signal is at logic 0, depending on control inputs PC2 and PC3. Reference Table 2.

The S0 signal is transmitted through NOR gate 201 to the D-input of flip-flop 202. The S0 bit (see table 1) is latched by flip-flop 202 and the output of flip-flop 202 is transmitted to the D-input of flip-flop 203. The S1 status bit of the processor is transmitted through NAND gate 207 to AND gates 206, 210 and 216. During program execution, the first processor cycle is an OPCODE fetch from program memory. The status bits S0 and S1 (see table 1) are decoded as a OPCODE fetch which clocks flip-flops 202, 203 and 204. The D-input to flip-flop 204 is the status bit S1 transmitted through gate 207 and 211. As a result, the Q output of flip-flop 204 is transmitted through gate 212 and gate 214 to produce a logic 1 on the CODE lead. Correspondingly a logic 0 is simultaneously produced on the DATA lead through inverter 215.

During an OPCODE fetch cycle the PROMENB signal takes on a logic 1 value. The PROMENB signal is used as a clock input to an external latch (not shown) in which the OPCODE is used as an address to PROM memory (not shown). The memory will decode the fetched instruction to determine whether the OPCODE is a single byte or multi-byte instruction. For a single byte instruction the value of the PROMOUT signal will be logic 1 and for a multi-byte instruction logic 0.

For Intel 8085 application, a single byte OPCODE fetch is followed by any memory accesses to the data area. If the PROMOUT signal is high, any further memory accesses will force the CODE signal to go low and the DATA signal to go high. On the other hand, for multi-byte OPCODE fetch, the PROMOUT signal will be low and two following memory read cycles will be from the code area. Accordingly, the CODE signal will be high for two memory reads following OPCODE fetch. Any further read cycles will be made from the data area. Note that any write cycle to the memory is to the data area only.

Although the preferred embodiment of the invention has been illustrated, and that formed described in detailed, it will be readily apparent to those skilled in the art that various modifications may be made therein without departing from the spirit of the invention or from the scope of the appended claims.

What is claimed is:

1. In a digital processing system having a processor providing a processor address for transferring data to and from a dynamic RAM memory, said processor including a clock, a dynamic memory refresh circuit connected between said processor and said dynamic RAM memory, said dynamic memory refresh circuit comprising:

timing means connected to said clock and to said processor, said timing means being operated in response to said clock to transmit a periodic signal of a predetermined frequency;

control logic means connected between said timing means and said processor, said control logic means being operated in response to said periodic signal to transmit a hold signal to said processor for each periodic signal to suspend said process or transfers of data;

address generation means connected to said timing means, said address generation means being operated in response to said period signal to produce a row address strobe signal and to produce on refresh row address of a sequence of row addresses for refreshing a corresponding area of said memory;

said address generation means further operated to transmit said refresh row addresses to said dynamic RAM memory;

said processor being operated in response to said hold signal to produce a hold acknowledge signal;

said control logic means being further operated in response to said hold acknowledge signal to transmit a fresh address select signal;

address selection means connected to said control logic means, to said processor and to said memory, said address selection means being operated to transmit said processor address for data transfer or to transmit said refresh address to said memory;

said address selection means being further connected to said address generation means and being further operated in response to said hold acknowledge signal and to said address select signal to transmit said one produced refresh address to said memory to refresh said corresponding area of said memory; and strapping means connected to said timing means, said timing means being operated in response to a first value or a second value of said strapping means to produce said periodic signal of said predetermined frequency, said first and second values corresponding to the processor clock frequency being 3 MHz or 4 MHz, respectively.

2. A dynamic memory refresh circuit as claimed in claim 1, wherein said strapping means includes a connection to a source of logic 0, corresponding to said first value for operating said timing means at approximately a 3 MHz frequency or said strapping means includes a connection to a source logic 1, corresponding to said second value, for operating said timing means at approximately a 4 MHz frequency.

3. A dynamic memory refresh circuit as claimed in claim 2, said timing means including:

first counting means connected to said clock and to said strapping means, said first counting means being operated to produce a first count signal of approximately 1 MHz frequency;

second counting means connected to said first counting means and being operated in response to said first count signal to produce a second count signal of approximately 200 KHz frequency; and third counting means connected to said second counting means, to said address generation means and to said control logic means, said third counting means being operated in response to said second count signal to produce said periodic signal at approximately a 15 microsecond rate.

4. A dynamic memory refresh circuit as claimed in claim 3, said first counting means including:

first latching means connected to said clock;

first gating means connected to said first latching means and to said strapping means; and second latching means connected to said first gating means, to said first latching means and to said clock, said second latching means being operated to produce said first count signal.

5. A dynamic memory refresh circuit as claimed in claim 3, said second counting means including:

first latching means connected to said first counting means;

first gating means connected to said first latching means;

second latching means connected to said first gating means, to said first latching means and to said first counting means;

second gating means connected to said second latching means and to said first latching means; and third latching means connected to said second gating means and to said first latching means, said third gating means being operated to produce said second count signal.

6. A dynamic memory refresh circuit as claimed in claim 3, said third counting means including:

first latching means connected to said second counting means;

first gating means connected to said first latching means; and second latching means connected to said second counting means, to said first gating means and to said first latching means, said second latching means being operated to produce said 15 microsecond rate pulses.

7. A dynamic memory refresh circuit as claimed in claim 3, said address generation means including:

sequencing means connected to said processor and to said third counting means, said sequencing means being operated in response to each of said 15 microsecond rate pulses to produce a plurality of refresh address bits representing said refresh address of memory; and refresh bus means connected between said sequencing means and said address selection means, said refresh bus means being operated to transmit each of said plurality of refresh address bits to said address selection means for refreshing said memory.

8. A dynamic memory refresh circuit as claimed in claim 7, said sequencing means including:

a plurality of latching means, each of said latching means being connected to said processor and to said third counting means, and being operated in response to each said 15 microsecond pulse to produce 1-bit of said refresh address; and each said latching means connected in an ordered sequence, so that each latching means is connected to its preceding and succeeding latching means for sequentially decrementing each refresh address produced in response to one 15 microsecond pulse.

9. A dynamic memory refresh circuit as claimed in claim 8, wherein:

each of said latching means includes a J-K flip-flop having its −Q output connected to the K-input of the next succeeding J-K flip-flop; and a first J-K flip-flop having its Q output connected to its K-input and having its clock-input connected to said third counting means.

10. A dynamic memory refresh circuit as claimed in claim 3, said control logic means including:

first latching means connected to said third counting means and to said processor, said first latching means being operated in response to each said periodic signal to produce said hold signal.

11. A dynamic memory refresh circuit as claimed in claim 10, said control logic means further including:

first gating means connected to said first latching means and to said processor, said first gating means being operated in response to said hold acknowledge signal to produce an enabling signal; and second latching means connected to said clock and to said first gating means, said second latching means being operated in response to said enabling signal to produce said refresh address select signal.

12. A dynamic memory refresh circuit as claimed in claim 11, said control logic means further including:

third latching means connected to said first and to said second latching means; and second gating means connected to said third latching means and to said first latching means, said second gating means being operated to reset said first latching means.

13. A dynamic memory refresh circuit as claimed in claim 9, said address selection means including:

first multiplexing means connected to said processor and to said sequencing means, said first multiplexing means being operated to transmit a low-byte address of either said processor address or said refresh address; and second multiplexing means connected to said first multiplexing means and to said memory, said second multiplexing means being operated to transmit either said low-byte address or a high-byte of said processor address.

14. A dynamic memory refresh circuit as claimed in claim 13, said first multiplexing means including a plurality of combination gating means, each of said combination gating means connected to said processor via a corresponding processor address bit and connected to said sequencing means via said corresponding refresh address bit.

15. A dynamic memory refresh circuit as claimed in claim 14, wherein each of said plurality of combination gates includes a two-AND/one-NOR gating device.

16. A dynamic memory refresh circuit as claimed in claim 14, said second multiplexing means including:

a plurality of gating means; and each of said plurality of gating means including:

first NAND gating means connected to a corresponding combination gating means;

second NAND gating means connected to a corresponding bit of said high-byte of said processor address; and third NAND gating means connected to said first and to said second NAND gating means and to a corresponding bit of said memory address.

17. A dynamic memory refresh circuit as claimed in claim 16, each of said first, second and third NAND gating means including a NAND gate device.

18. A dynamic memory refresh circuit as claimed in claim 13, said address selection means further including latching means connected to said processor, to said memory and to said second multiplexing means, said latching means being operated to control transmission of said low-byte address to memory and to control transmission of said high-byte address to memory.

19. A dynamic memory refresh circuit as claimed in claim 18, said address selection means further including first gating means connected between said latching means and said second multiplexing means for enabling said low-byte and said high-byte addresses.

20. A dynamic memory refresh circuit as claimed in claim 18, said address selection means further including second gating means connected to said processor, to said latching means and to said memory, said second gating means being operated to transmit a plurality of memory control signals for latching said memory address bytes into said memory.

21. A dynamic memory refresh circuit as claimed in claim 1, said dynamic memory refresh circuit comprising a single chip CMOS gate array microcircuit.

22. A dynamic memory refresh circuit as claimed in claim 1, said address selection means being cyclically operated over a period of time in response to a plurality of said periodic signals to refresh all areas of said memory.

* * * * *